(12) United States Patent
Khalaf

(10) Patent No.: US 12,733,100 B2
(45) Date of Patent: Sep. 8, 2026

(54) REDUCING PRINTED CIRCUIT BOARD AREA FOR SINGLE-SIDED PRINTED CIRCUIT BOARD

(71) Applicant: SK Hynix NAND Product Solutions Corp., San Jose, CA (US)

(72) Inventor: Bilal Khalaf, Folsom, CA (US)

(73) Assignee: Solidigm Inc., Rancho Cordova, CA (US)

( * ) Notice: Subject to any disclaimer, the term of this patent is extended or adjusted under 35 U.S.C. 154(b) by 756 days.

(21) Appl. No.: 18/070,119

(22) Filed: Nov. 28, 2022

(65) Prior Publication Data

US 2024/0179844 A1 May 30, 2024

(51) Int. Cl.
*H05K 1/14* (2006.01)

(52) U.S. Cl.
CPC ............. *H05K 1/145* (2013.01); *H05K 1/141* (2013.01); *H05K 1/144* (2013.01)

(58) Field of Classification Search
CPC .... H05K 1/14; H05K 1/141–147; H05K 1/18; H05K 1/181–187; H05K 2201/09063; H05K 2201/10159; H01L 23/498; H01L 23/552
USPC ................ 361/770–778, 790, 792–795, 803; 257/685–690, 723–730
See application file for complete search history.

(56) References Cited

U.S. PATENT DOCUMENTS

| | | | | |
|---|---|---|---|---|
| 8,208,270 | B2 * | 6/2012 | Mori | H05K 3/368 361/795 |
| 9,706,661 | B2 * | 7/2017 | Choi | H01L 23/552 |
| 9,865,310 | B2 * | 1/2018 | Cantle | G11C 5/04 |
| 10,223,316 | B2 | 3/2019 | Mataya | |
| 11,037,044 | B2 | 6/2021 | Lotya et al. | |
| 11,452,246 | B2 * | 9/2022 | Paynter | H01L 23/552 |
| 2004/0183193 | A1 * | 9/2004 | Koide | H01L 23/50 257/E23.079 |
| 2005/0168961 | A1 * | 8/2005 | Ono | H05K 1/183 257/E25.011 |
| 2007/0127725 | A1 | 6/2007 | Tominaga et al. | |
| 2012/0182699 | A1 * | 7/2012 | Zhang | H05K 1/141 361/742 |
| 2013/0127025 | A1 * | 5/2013 | Cho | H01L 25/16 257/E23.114 |
| 2014/0362535 | A1 * | 12/2014 | Meier | H01L 23/367 361/761 |
| 2018/0331081 | A1 * | 11/2018 | Goh | H10W 90/00 |
| 2019/0098802 | A1 * | 3/2019 | Mokler | H05K 9/0028 |
| 2022/0005757 | A1 * | 1/2022 | Oh | H01L 23/49827 |

FOREIGN PATENT DOCUMENTS

| | | |
|---|---|---|
| KR | 10-2010-0011324 A | 2/2010 |
| KR | 10-2013-0042200 A | 4/2013 |

* cited by examiner

*Primary Examiner* — Tuan T Dinh
(74) *Attorney, Agent, or Firm* — HG LAW LLP

(57) ABSTRACT

A device includes a single-sided printed circuit board with an opening and a double-sided printed circuit board. The single-sided printed circuit board includes a first and a second side and has an opening extending from the first side. The double-sided printed circuit board is arranged and affixed in the opening of the single-sided printed circuit board, and components extending from one of the sides of the double-sided printed circuit board protrude into the opening but do not protrude beyond the second surface of the single-sided printed circuit board.

28 Claims, 14 Drawing Sheets

REDUCING PRINTED CIRCUIT BOARD AREA FOR SINGLE-SIDED PRINTED CIRCUIT BOARD

INTRODUCTION

The present disclosure is directed to reducing area for a printed circuit board. More specifically, the present disclosure is directed to allowing for more components to be used in a printed circuit board.

SUMMARY

In some embodiments, a device comprises a single-sided printed circuit board and a double-sided printed circuit board. The single-sided printed circuit board comprises a first side, a second side, and a connector. The first side comprises a first surface from which components can extend, and the second side comprises a second surface. The single-sided printed circuit board further comprises an opening from the first side through the second side. The double-sided board is arranged and affixed in the opening and comprises a third side and a fourth side. The third side comprises a third surface from which components extend, and the fourth side comprises a fourth surface from which components extend. The third surface and the first surface face a first direction, and the fourth surface and the second surface face a second direction, and the components extending from the fourth surface do not extend beyond the second surface.

In some embodiments, a device comprises a single-sided printed circuit board and a double-sided printed circuit board. The single-sided printed circuit board comprises a first side, a second side, and a connector. The first side comprises a first surface from which components can extend, and the second side comprises a second surface. The single-sided printed circuit board further comprises an opening from the first side through the second side. The double-sided board is arranged and affixed in the opening and comprises a third side and a fourth side. The third side comprises a third surface from which components extend, and the fourth side comprises a fourth surface from which components extend. The third surface and the first surface face a first direction, and the fourth surface and the second surface face a second direction, and the components extending from the fourth surface do not extend beyond the second surface.

In some embodiments, the device comprises a M.2 form factor, 2.5" form factor, mSATA form factor, U.2 form factor, 2230 form factor, 2242 form factor, 2280 form factor, or 22110 form factor. The device may have the double-sided printed circuit board soldered to the single-sided printed circuit board. The opening in the device may be a first opening, with the device further comprising at least one additional opening, wherein the double-sided printed circuit board is arranged and affixed within the first opening and within the at least one additional opening. The double-sided printed circuit board may be a first double-sided printed circuit board, wherein the device may further comprise at least one additional double-sided printed circuit board, wherein the at least one additional double-sided printed circuit board is arranged and affixed in a respective one of the at least one additional opening.

In some embodiments, components extending from the fourth surface of the device are arranged in the opening and wherein at least the third surface is arranged above the first surface. The components extending from the fourth surface comprise at least one of a NAND flash memory, an application-specific integrated circuit, a power management integrated circuit, a system in a package (SIP), or a temperature sensitive component. The device may further comprise a heat spreader that covers the components extending from the fourth surface, wherein the heat spreader does not extend beyond the second surface.

In some embodiments, a double-sided printed circuit board comprises a first side and a second side. The first side comprises a first surface from which components extend, and the second side comprises a second surface from which components extend. The double-sided printed circuit board is configured to be arranged and affixed in an opening of a single-sided printed circuit board, wherein the single-sided printed circuit board comprises a third side and a fourth side, and the opening extends from the third side through the fourth side. The third side comprises a third surface, and the fourth side comprises a fourth surface, and the components extending from the second surface extend into the opening but do not extend beyond the fourth surface.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and should not be considered limiting of the breadth, scope, or applicability of these concepts. It should be noted that for clarity and ease of illustration, these drawings are not necessarily made to scale.

DETAILED DESCRIPTION

In some applications, it is not possible to use a double-sided printed circuit board (PCB) because of, for example, space constraints, such as in a compact laptop design in which a particular form factor (e.g., M.2 form factor) is required for the PCB. In order to meet the requirements, a single-sided PCB is used instead. However, use of a single-sided PCB necessarily results in having fewer components affixed onto the PCB than if a double-sided PCB was used instead. Provided herein are PCB designs and arrangements that increase the number of the components that may be provided while meeting the requirements for a single-sided PCB.

For example, a single-sided PCB (that meets a design requirement) is provided with a window or depression in a portion of the board making up the PCB. A second PCB, which is double-sided, is arranged and affixed in this depression or window. In this way, the single-sided PCB, with components extending from one side, and the double-sided PCB can accommodate more components than the single-sided PCB would be able to (i.e., without the window or depression). In order to conform to the size and geometry requirements (i.e., that the single-sided PCB would meet on its own), the new device made of both the single-sided PCB and the double-sided PCB is provided such that components on the double-sided PCB that are located on the side facing the same direction as the bottom side of the single-sided PCB (i.e., the side without components protruding therefrom) do not extend beyond the bottom side of the single-sided PCB. In the case of a depression (as opposed to a cut-through window), components from the double-sided PCB will not extend beyond the surface created by the depression.

The components protruding into the window or depression may include any suitable components that are otherwise capable of being affixed to a PCB and that will not protrude beyond the bottom side of the single-sided PCB. For example, such components may include NAND flash memory, application-specific integrated circuits, a power management integrated circuit, a temperature sensitive component, any other suitable integrated circuitry or component, or any combination thereof. In some embodiments, a heat spread or other suitable covering may cover the components protruding into the depression to dispel thermal buildup to the extent that any such covering will not protrude beyond the bottom side of the single-sided PCB.

In some embodiments, the single-sided PCB may include more than one window, depression, or both. Respective double-sided PCBs may be arranged and affixed in each depression and/or window, or a single double-sided PCB may be arranged and affixed such that components located on the double-sided PCB that are on the side facing the same direction as the bottom side of the single-sided PCB protrude into each window and/or depression without protruding beyond the bottom side of the single-sided PCB.

Figure 1A:
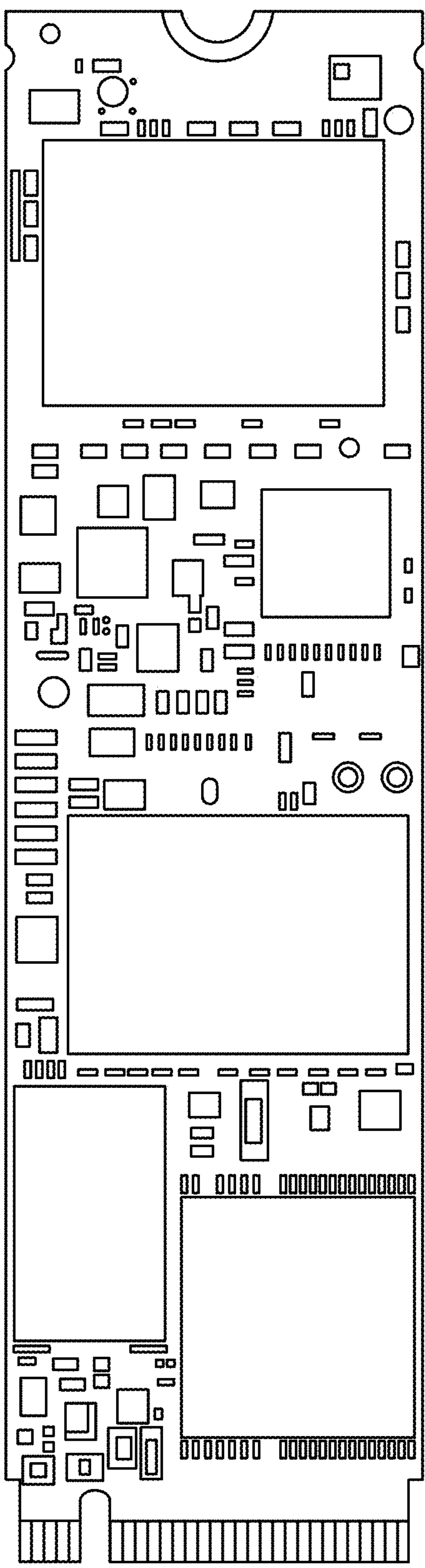
FIGS. 1A-1C show illustrative examples of three different PCBs that each has a respective form factor.
Figure 1B:
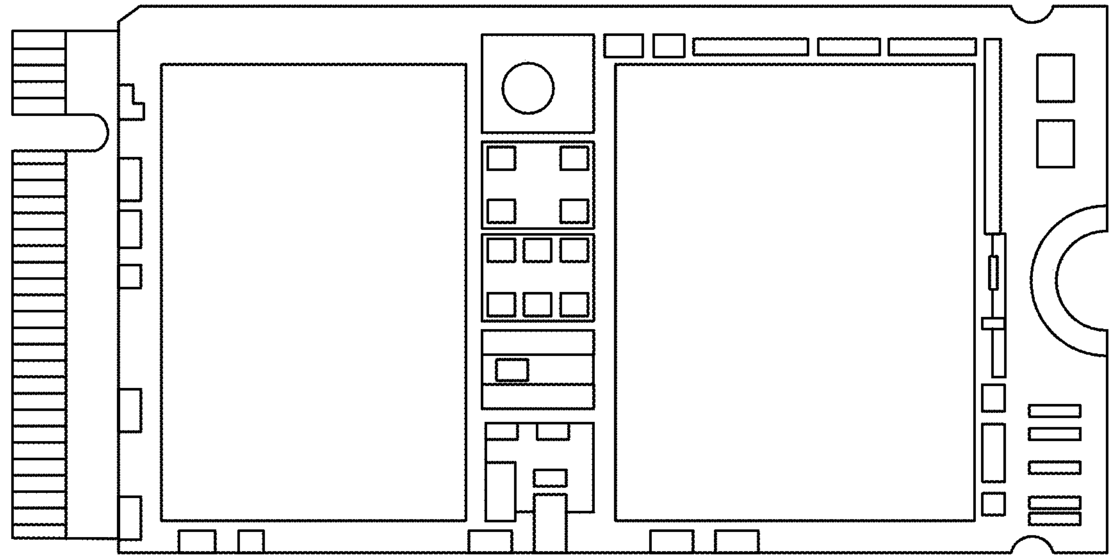
Figure 1C:
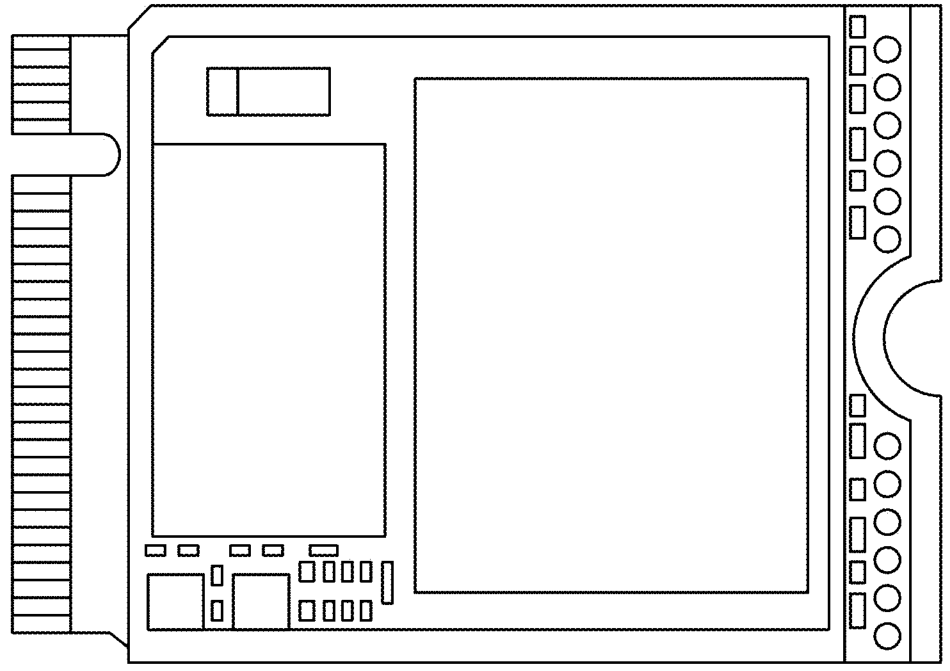

FIG. 1A, FIG. 1B, and FIG. 1C show illustrative examples of three different PCBs that each has a respective form factor. FIG. 1A shows a PCB having a M.2 2280 form factor. FIG. 1B shows a PCB having a M.2 2242 form factor. FIG. 1C shows a PCB having a M.2 2230 form factor. It will be understood that other form factors, such as a 2.5" form factor, mSATA form factor, U.2 form factor, 22110 form factor, any suitable similar form factor, or a combination thereof may also be utilized in some embodiments of the present disclosure.

Figure 2:
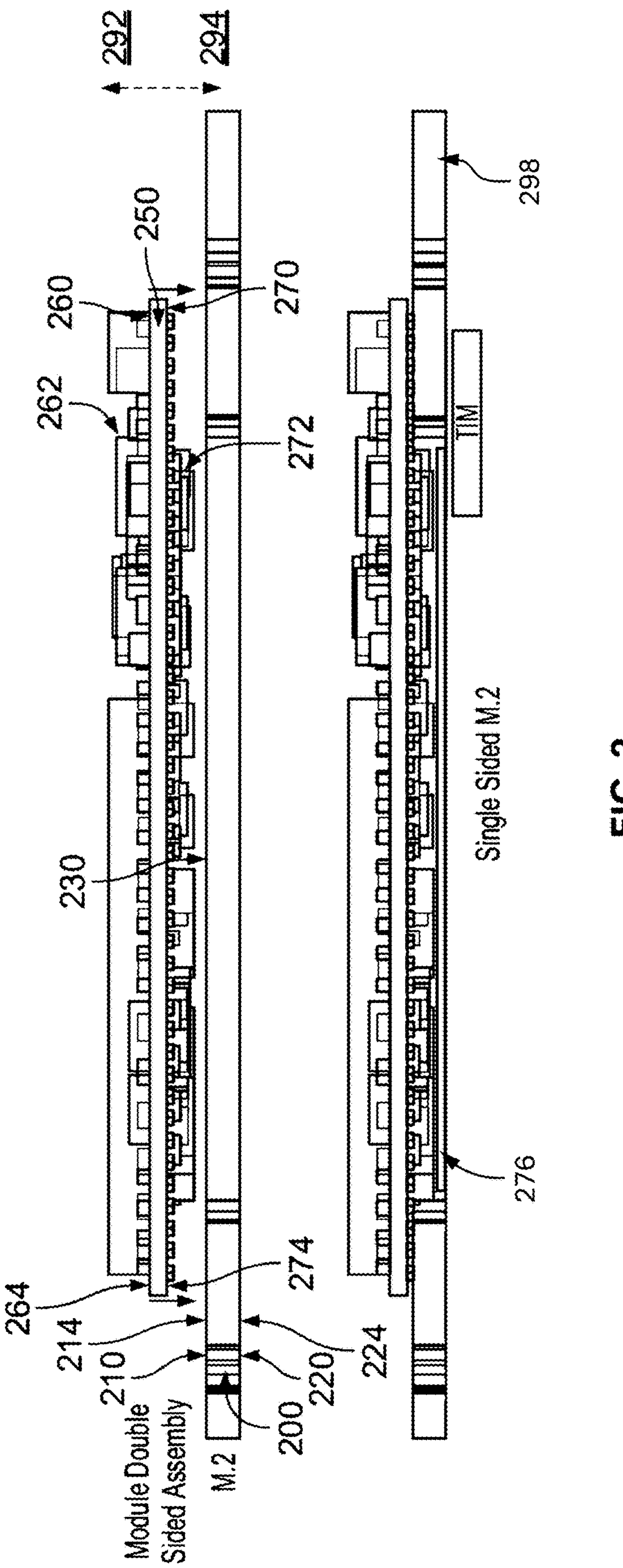
FIG. 2 shows a side view of an illustrative device incorporating a single-sided PCB and a double-sided PCB, in accordance with some embodiments of the present disclosure.

FIG. 2 shows a side view of an illustrative device incorporating a single-sided PCB 200 and a double-sided PCB 250, in accordance with some embodiments of the present disclosure. FIG. 2 depicts an illustrative example of a single-sided PCB 200 with an opening 230 and with a double-sided PCB 250 being arranged and affixed thereon. The exemplary single-sided PCB 200 includes a first side 210 with a first surface 214, a second side 220 with a second surface 224, an opening 230, and a double-sided PCB 250 that includes a third side 260, where the third side 260 includes a third surface 264 on which second components 262 are arrangeable, and a fourth side 270, where the fourth side 270 includes a fourth surface 274 on which third components 272 are arrangeable, and a connector 298, although other visual and/or physical components may be included or substituted in other embodiments. It will be understood that other dimensions, such as height, length, width, any suitable similar dimensions, or a combination thereof, may be utilized for the single-sided PCB 200 or the double-sided PCB 250, for instance, so that the device meets the requirements of a specified form factor such as an M.2 form factor, 2.5 " form factor, mSATA form factor, U.2 form factor, 2230 form factor, 2242 form factor, 2280 form factor, 22110 form factor, any suitable similar form factor, or a combination thereof. It will be further understood that single-sided PCB 200 may be a double-sided PCB, a single-sided substrate on which components may be arranged, a double-sided substrate on which components may be arranged, or any suitable similar element on which components may be arranged. The double-sided PCB 250 may also be arranged and affixed onto the single-sided PCB 200 in different locations, and other components may be arranged in the opening 230 (e.g., a heat spreader covering the third components 272), as long as no components protrude beyond the second surface 224 on the second side 220. Additionally, a heat spreader 276 may cover the third components 272 arranged of the fourth surface 274, as long as the heat spreader 276 does not protrude beyond the second surface 224.

The single-sided PCB 200 includes a first side 210. First side 210 includes a first surface 214 that faces a first direction 292, and it will be understood that the first surface 214 may have first components (not shown in FIG. 2) arranged thereon, where the first components may include a NAND flash memory, an application-specific integrated circuit, a power management integrated circuit, a temperature sensitive component, a system in a package (SIP), any suitable similar components, or a combination thereof.

The single-sided PCB 200 includes a second side 220. Second side 220 includes a second surface 224 that faces a second direction 294, and it will be understood that there are no components arranged on the second surface 224.

The single-sided PCB 200 includes an opening 230, where the opening 230 is a rectangular depression on first side 210, although other shapes and sizes of opening 230 may be utilized as well. It will be understood that opening 230 extends at least partially from the first side 210 to second side 220. In some embodiments, the opening 230 may extend through to the second side 220, and it will be understood that in this depiction, third components 272 may protrude into the opening 230 but do not protrude beyond the second surface 224 of second side 220. In another suitable approach, the opening 230 does not extend through to the second side 220, and the first side 210 further includes a fifth surface in the opening (e.g., fifth surface 780 shown in FIG. 7). The third components 272 may protrude into the opening 230 but do not protrude beyond the fifth surface. In another suitable approach, where single-sided PCB 200 is a double-sided substrate, as described in a previous example, the opening 230 may be a first opening that extends at least partially from first side 210 to second side 220, and a second opening may extend at least partially from second side 220 to first side 210, where the second opening will be understood to have similar designs and functions to that of first opening 230.

The single-sided PCB 200 includes a double-sided PCB 250, where the double-sided PCB 250 is arranged and affixed into the opening 230 on the single-sided PCB 200. For example, the double-sided PCB 250 may be soldered onto the first surface 214 of first side 210. In another suitable approach, double-sided PCB 250 may be installed directly and/or partially into the opening 230 (e.g., attached directly to the single-sided PCB 200). It will be understood that different shapes, sizes, dimensions (e.g., width, length, thickness), other suitable similar dimensions, or a combination thereof may be utilized for double-sided PCB 250, as long as the device has the specified form factor. It will be further understood that while double-sided PCB 250 is shown as being arranged and affixed in opening 230, any other suitable device may be arranged either in addition to or in place of double-sided PCB 250, such as, for instance, an integrated circuit, a package such as a field-programmable gate array (FPGA), system in a package (SIP), suitable similar components, or a combination thereof, as long as the substituted element protrudes into opening 230 without protruding beyond the second surface 224 (or the fifth surface, if applicable). For example, double-sided PCB 250 may have one or more SIPs arranged on one or both sides. In another suitable approach, double-sided PCB 250 may be arranged on a half of opening 230, and a suitable component such as a SIP, an integrated circuit, or another PCB may be arranged separately on the other half of opening 230. In another suitable approach, opening 230 may be a first opening, double-sided PCB 250 may be a first double-sided PCB, and double-sided PCB 250 may have no components arranged on one side (i.e., double-sided PCB 250 is instead a single-sided PCB) and may further include a second opening thereon, and a suitable component, such as a SIP, an integrated circuit, or a second double-sided PCB may be arranged and affixed in the second opening. In another previously described approach, where single-sided PCB 200 is a double-sided substrate with a first opening extending at least partially from first side 210 to first side 220 and a second opening extending at least partially from second side 220 to first side 210, double-sided PCB 250 may be a first double-sided PCB and may be arranged and affixed in the first opening, and a second double-sided PCB that shares similar designs and functions to that of the first double-sided PCB may be arranged and affixed in the second opening.

The double-sided PCB 250 includes a third side 260 with a third surface 264 on which second components 262 are arrangeable. The third surface 264 faces the first direction 292, and the second components 262 may include a NAND flash memory, an application-specific integrated circuit, a power management integrated circuit, a temperature sensitive component, any suitable similar components, or combinations thereof.

The double-sided PCB 250 includes a fourth side 270 with a fourth surface 274 on which third components 272 are arrangeable. The fourth surface 274 faces the second direction 294, and the third components 272 may include a NAND flash memory, an application-specific integrated circuit, a power management integrated circuit, a temperature sensitive component, a SIP, any suitable similar components, or a combination thereof. Third components 272 protrude into the opening 230 that extends at least partially from the first side 210 to the second side 220. For example, if the opening 230 does not extend through to the second surface 224 of the second side 220, then the third components 272 protrude into the opening 230 but do not protrude beyond the fifth surface (e.g., fifth surface 780 in FIG. 7). In another suitable approach, if the opening 230 instead extends through to the second side 220, then the third components 272 protrude into the opening 230 but do not protrude beyond the second surface 224 of second side 220. Moreover, it will be understood that additional components, such as a heat spreader, may be arranged in the opening 230 covering the third components 272, as long as none of the components protrude beyond either the second surface 224 or the fifth surface (if applicable).

The single-sided PCB 200 includes a connector 298 that connects the single-sided PCB 200 to an external circuit such as a different PCB, a motherboard, or other similar circuitry. For example, if the single-sided PCB 200 has an M.2 form factor and is a compact solid-state drive (SSD) in a laptop, then the connector 298 may electrically couple the device to a motherboard. In another suitable approach, if the single-sided PCB 200 is configured to provide power, then the connector 298 may electrically couple directly to an external object (e.g., a light, a motor, a fan, or an object that utilizes electrical power) that receives the provided power.

Figure 3:
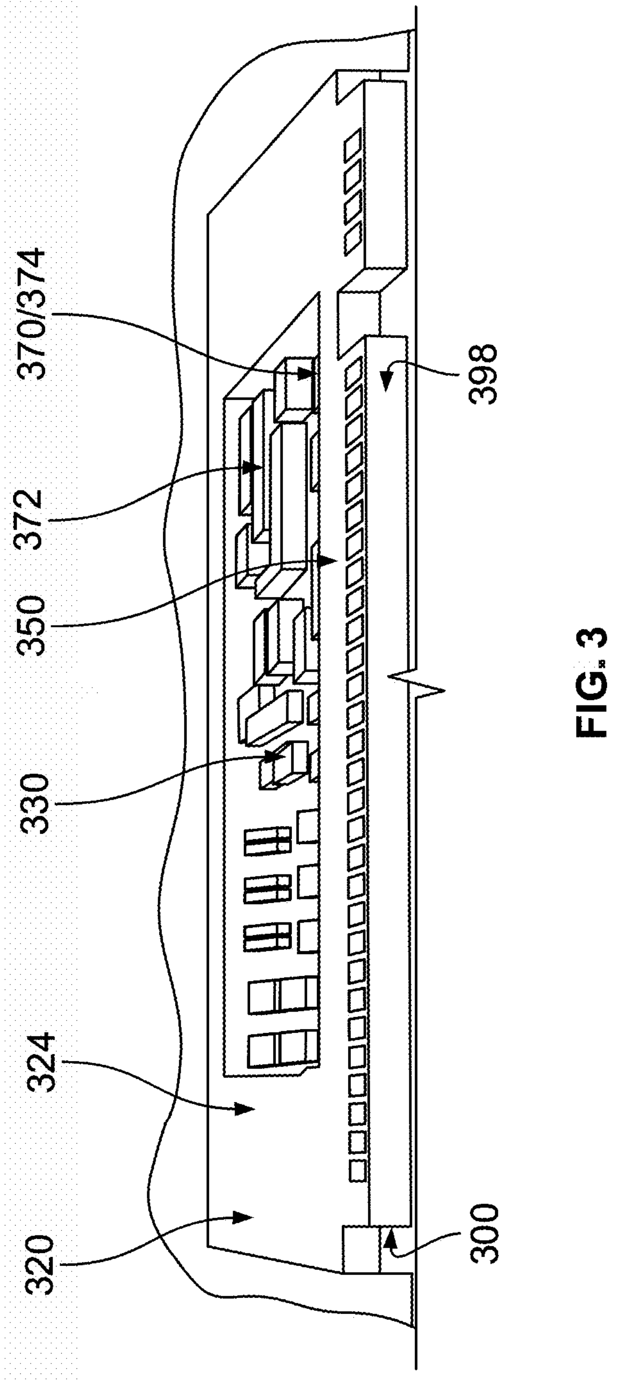
FIG. 3 shows a side view of an illustrative single-sided PCB with a double-sided PCB arranged and affixed thereon, in accordance with some embodiments of the present disclosure.

FIG. 3 shows a side view of an illustrative single-sided PCB 300 with a double-sided PCB 350 arranged and affixed thereon, in accordance with some embodiments of the present disclosure. The exemplary single-sided PCB 300 includes a second side 320 with a second surface 324, an opening 330, an arranged and affixed double-sided PCB 350 with fourth side 370 with a fourth surface 374 on which third components 372 are arrangeable, and a connector 398 (e.g., having similar designs and functions to that of the previously described connector 298), although other visual and/or physical components may be included or substituted in other embodiments (e.g., the first side 210 on the single-sided PCB 200 and the third side 260 on the double-sided PCB 250, as previously described in FIG. 2).

The single-sided PCB 300 includes a second side 320 with a second surface 324, and it will be understood that these elements have similar functions and designs to that of the previously described second side 220 that has the second surface 224 in FIG. 2.

The single-sided PCB 300 includes an opening 330 that extends through to the second side 320 of the single-sided PCB 300 and is rectangular in shape, although it will be understood that different shapes, sizes, and locations of opening 330 may be utilized. Components from a fourth surface 374 on a fourth side 370 on a double-sided PCB 350 that is arranged and affixed on single-sided PCB 300 may protrude into opening 330, but do not protrude beyond the second surface 324 of second side 320.

The single-sided PCB 300 includes a double-sided PCB 350 arranged and affixed thereon, and the double-sided PCB 350 includes a fourth side 370 with a fourth surface 374 on which third components 372 are arrangeable. It will be understood that fourth side 370, fourth surface 374, and third components 372 have similar designs and functions to that of fourth side 270, fourth surface 274, and third components 272, respectively.

Figure 4A:
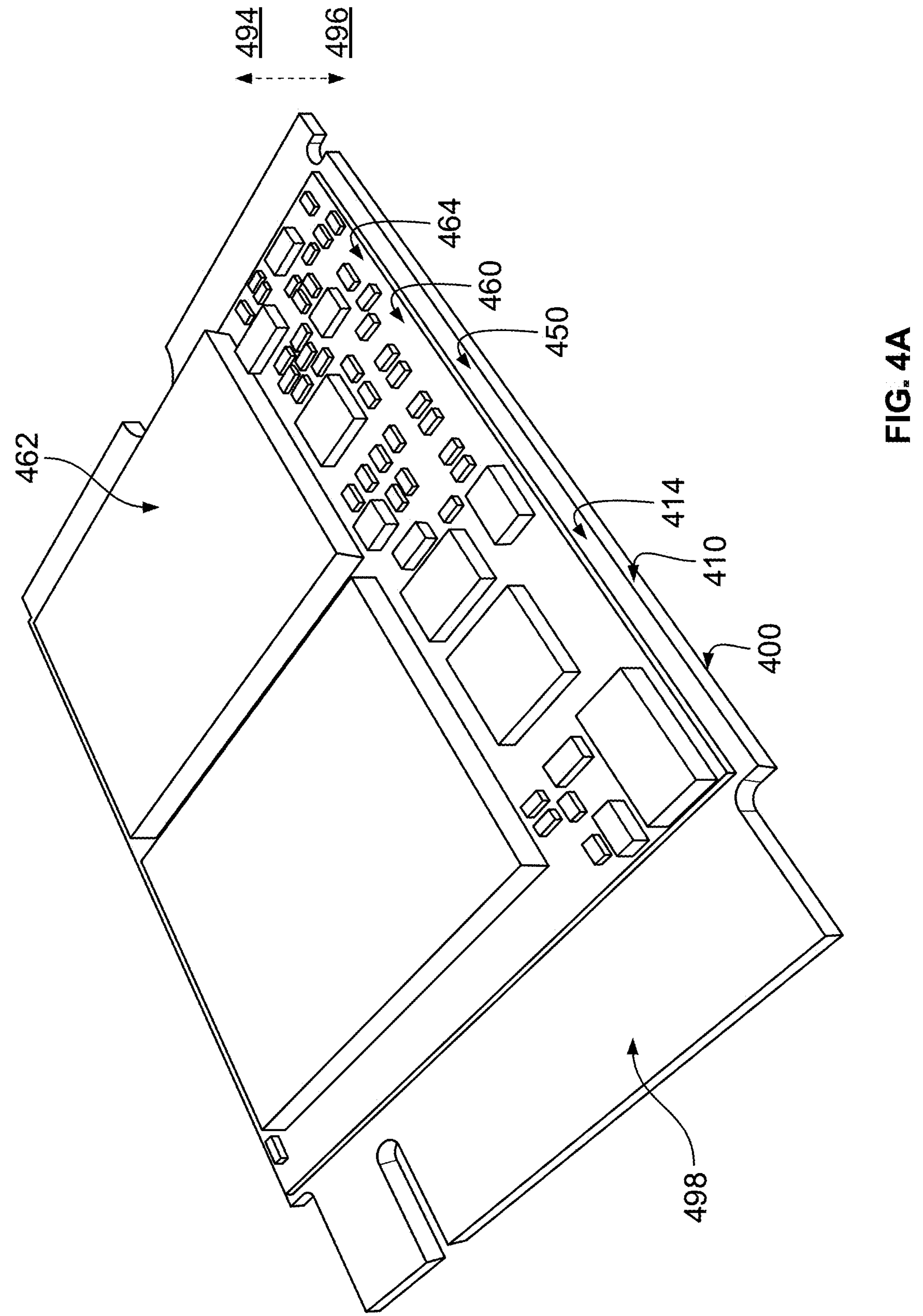
FIGS. 4A-4C show a top view, a bottom view, and a layered view, respectively, of an illustrative device incorporating a single-sided PCB and a double-sided PCB, in accordance with some embodiments of the present disclosure.

FIG. 4A shows a top view of an illustrative device incorporating a single-sided PCB 400 and a double-sided PCB 450, in accordance with some embodiments of the present disclosure. The exemplary single-sided PCB 400 includes a first side 410 with a first surface 414, a double-sided PCB 450 arranged and affixed thereon, where double-sided PCB 450 has a third side 460 with a third surface 464 on which second components 462 are arrangeable, and a connector 498 (e.g., having similar designs and functions to that of the previously described connector 298), although other visual and/or physical components may be included or substituted in other embodiments (e.g., the second side 320 on the single-sided PCB 300 and the fourth side 370 on the double-sided PCB 350, as previously described in FIG. 3).

The single-sided PCB 400 includes a first side 410 with a first surface 414, and it will be understood that these elements have similar functions and designs to that of the previously described first side 210 that has the first surface 214 in FIG. 2. For example, first side 410 with first surface 414 faces a first direction 492, and may (or may not) have first components arranged thereon, where the first components may include a NAND flash memory, an application-specific integrated circuit, a power management integrated circuit, a temperature sensitive component, a SIP, any suitable similar components, or a combination thereof.

The single-sided PCB 400 includes a double-sided PCB 450 arranged and affixed on the first surface 414 of first side 410. For example, the double-sided PCB 450 may be soldered onto the first surface 414 of first side 410. It will be understood that different shapes, sizes, dimensions (e.g., width, length, thickness), other suitable similar dimensions, or a combination thereof may be utilized for double-sided PCB 250, as long as the device has the specified form factor. It will be further understood that while double-sided PCB 450 is shown as being arranged and affixed on single-sided PCB 400, any other suitable device may be arranged either in addition to or in place of double-sided PCB 450, such as, for instance, an integrated circuit, a package such as a field-programmable gate array (FPGA), system in a package (SIP), suitable similar components, or a combination thereof. For example, double-sided PCB 450 may have one or more SIPs arranged on one or both sides.

The double-sided PCB 450 includes a third side 460 with a third surface 464 on which second components 462 are arrangeable. The third surface 464 faces the first direction 492, and the second components 462 may include a NAND flash memory, an application-specific integrated circuit, a power management integrated circuit, a temperature sensitive component, a SIP, any suitable similar components, or a combination thereof.

Figure 4B:
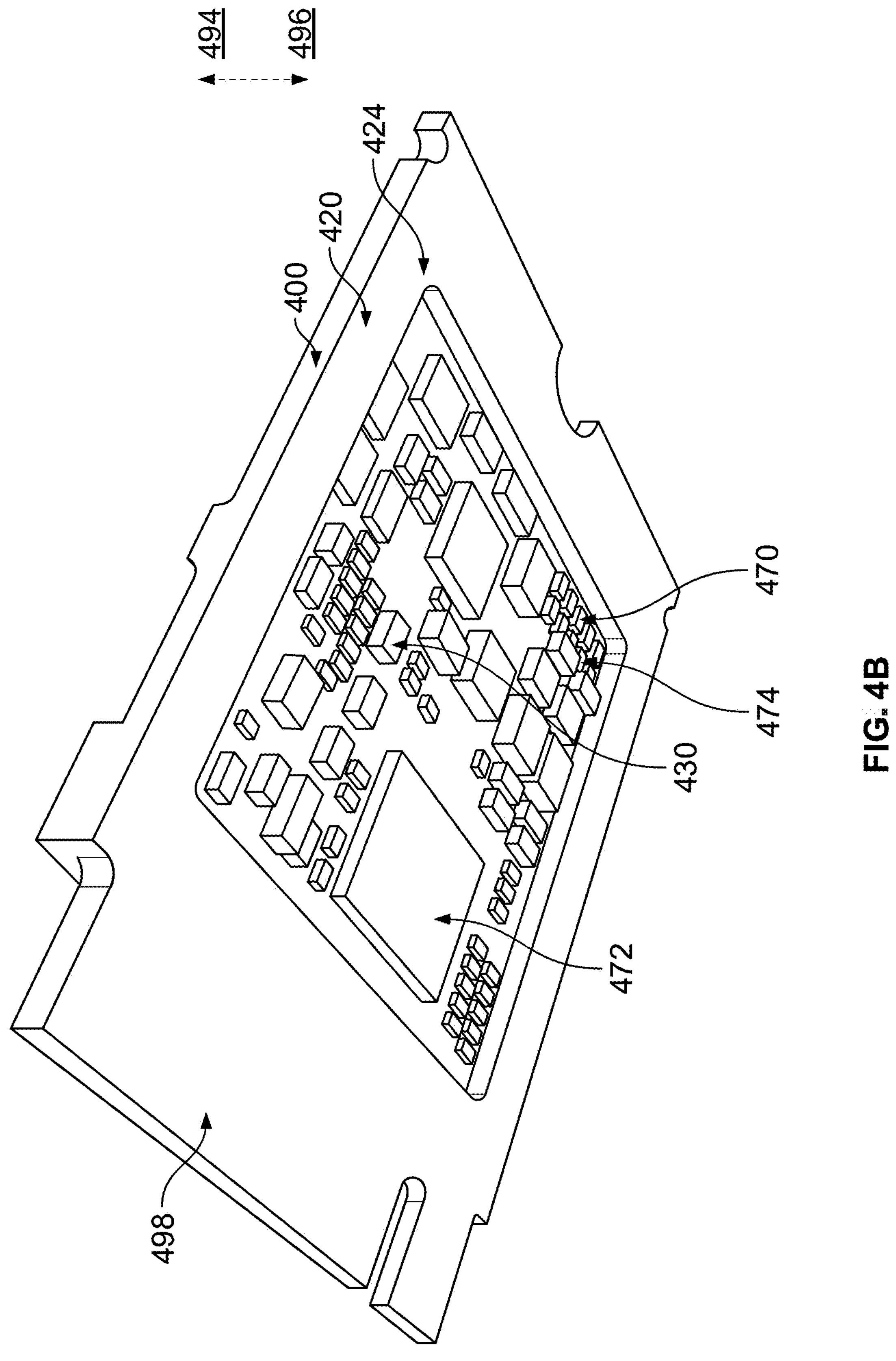

FIG. 4B shows a bottom view of the illustrative device incorporating the single-sided PCB 400 (i.e., depicted in FIG. 4A) and the double-sided PCB 450 (i.e., depicted in FIG. 4A), in accordance with some embodiments of the present disclosure. The exemplary single-sided PCB 400 includes a second side 420 with a second surface 424, an opening 430, and the double-sided PCB 450, the double-sided PCB 450 including a fourth side 470 with a fourth surface 474 on which third components 472 are arrangeable, and the connector 498 (i.e., as depicted in FIG. 4A), although other visual and/or physical components may be included or substituted in other embodiments (e.g., the first side 410 on the single-sided PCB 400 and the third side 460 on the double-sided PCB 450, as previously described in FIG. 4A).

The single-sided PCB 400 includes a second side 420 with a second surface 424 and that faces a second direction 494, and it will be understood that these elements have similar functions and designs to that of the previously described second side 220 that has the second surface 224 in FIG. 2.

The single-sided PCB 400 includes an opening 430, and it will be understood that the opening 430 has similar functions and designs to that of the previously described opening 330 in FIG. 3.

The single-sided PCB 400 includes the double-sided PCB 450 (i.e., depicted in FIG. 4A) arranged and affixed thereon, where the double-sided PCB 450 includes a fourth side 470 with a fourth surface 474 on which third components 472 are arrangeable. It will be understood that fourth side 470, fourth surface 474, and third components 472 face the second direction 494 and have similar designs and functions to that of the fourth side 270, the fourth surface 274, and the third components 272 on FIG. 2, respectively.

Figure 4C:
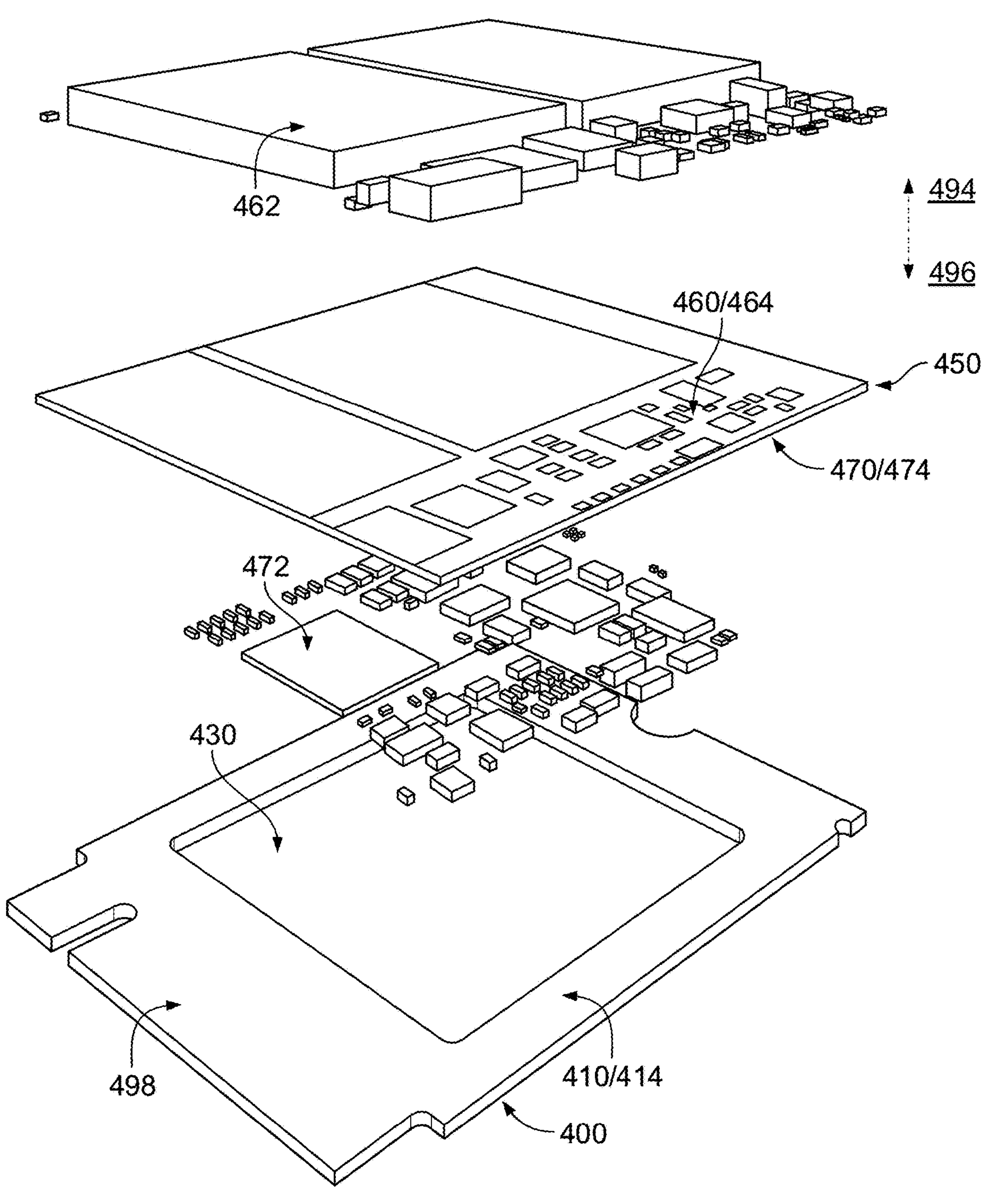

FIG. 4C shows a layered view of the illustrative device that includes the single-sided PCB 400 and the double-sided PCB 450. The exemplary single-sided PCB 400 includes the first side 410 with the first surface 414 and faces the first direction 492 (e.g., as depicted in FIG. 4A), an opening 430, a double-sided PCB 450 with a third side 460 (e.g., depicted in FIG. 4A) that has a third surface 464 on which second components 462 are arrangeable and that faces the first direction 492, and with a fourth side 470 (e.g., depicted in FIG. 4B) that has a fourth surface 474 on which third components 472 are arrangeable and that faces the second direction 494, although other visual and/or physical components may be included or substituted in other embodiments (e.g., the second side 420 on the single-sided PCB 400, as previously described in FIG. 4B).

FIG. 4C provides an illustrative depiction of the opening 430 that extends from the first surface 414 on first side 410 to the second side 420 (e.g., as described in FIG. 4B). The third components 472 arranged on the fourth surface 474 on fourth side 470 protrude into opening 430 but do not protrude beyond second surface 424 on second side 420. In another suitable embodiment, the opening 430 may extend partially from the first surface 414 on first side 410, without extending to the second side 420. If opening 430 does not extend to the second surface 424 on second side 420, then it will be understood that the first side 410 will include a fifth surface (e.g., fifth surface 780 in FIG. 7) that is in the opening 430 and that faces the first direction 492. It will be further understood that the third components 472 that protrude into opening 430 will not protrude beyond the fifth surface.

Figure 5:
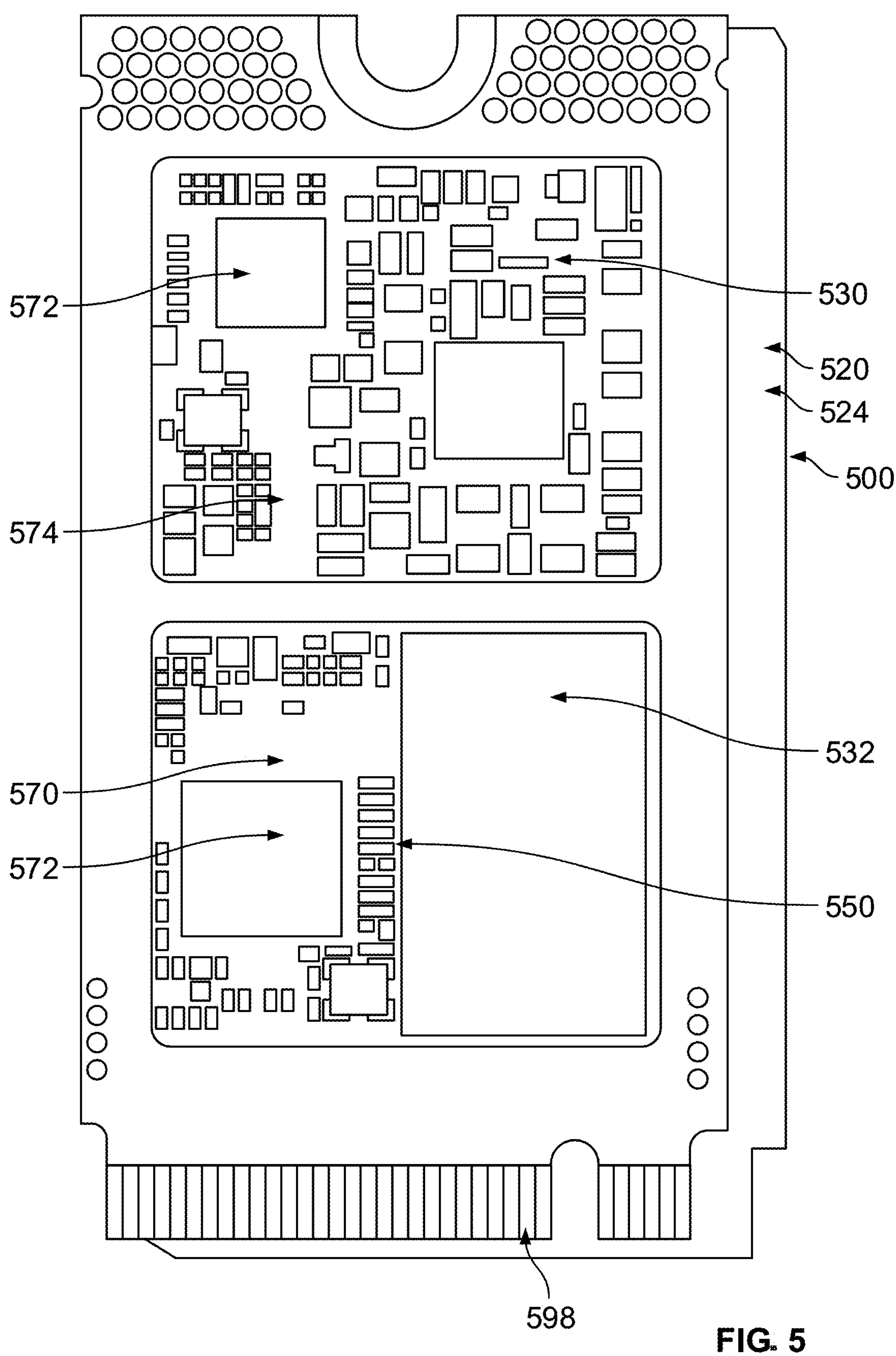
FIG. 5 shows an illustrative device having a 2242 form factor that incorporates a single-sided PCB with two openings and a double-sided PCB, in accordance with some embodiments of the present disclosure.

FIG. 5 shows an illustrative device with a 2242 form factor that incorporates a single-sided PCB 500 with two openings (i.e., a first opening 530 and a second opening 532) and a double-sided PCB 550, in accordance with some embodiments of the present disclosure. The exemplary single-sided PCB 500 includes a second side 520 with a second surface 524, a first opening 530, a second opening 532, a double-sided PCB 550 that includes a fourth side 570 with a fourth surface 572 on which third components 572 are arrangeable, and a connector 598 (e.g., having similar designs and functions to that of the previously described connector 298), although other visual and/or physical components may be included or substituted in other embodiments (e.g., the first side 210 on the single-sided PCB 200 and the third side 260 on the double-sided PCB 250, as previously described in FIG. 2).

The single-sided PCB 500 includes a second side 520 with a second surface 524, and it will be understood that these elements have similar functions and designs to that of the previously described second side 220 that has the second surface 224 in FIG. 2.

The single-sided PCB 500 includes a first opening 530, and it will be understood that the first opening 530 has similar functions and designs to that of the previously described opening 330 in FIG. 3.

The single-sided PCB 500 includes a second opening 532, where the second opening 532 has similar functions and possible designs to that of the previously described first opening 530. However, it will be understood that the second opening 532 may have a different shape, size, depth, similar suitable features, or a combination thereof compared to that of first opening 530. For example, first opening 530 and second opening 532 may have the same shape and size and may both extend through the second side 520, as in FIG. 5. In another suitable approach, one or both of the openings may not extend through the second side 520. In another suitable approach, there may be a third opening on single-sided PCB 500, where the third opening will have similar functions and possible designs to that of first opening 530 as well.

The single-sided PCB 500 includes a double-sided PCB 550 arranged and affixed thereon, and the double-sided PCB 550 includes a fourth side 570 with a fourth surface 574 on which third components 572 are arrangeable. It will be understood that fourth side 570, fourth surface 574, and third components 572 have similar designs and functions to that of fourth side 270, fourth surface 274, and third components 272 from FIG. 2, respectively. It will be further understood that the double-sided PCB 550 will be arranged and affixed onto the single-sided PCB 500 such that some of the third components 572 are protruding into first opening 530, and some of the third components 572 are protruding into second opening 532. In another suitable embodiment, the double-sided PCB 550 may be a first double-sided PCB 550, such that first double-sided PCB 550 is arranged and affixed such that third components 572 extend only into the first opening 530. In such a configuration, a second double-sided PCB may be simultaneously arranged and affixed onto single-sided PCB 500 such that components arranged on a side of the second double-sided PCB protrude into the second opening 532. In another suitable approach, at least one opening may include both a double-sided PCB arranged and affixed therein and another suitable component, such as a SIP or an integrated circuit, simultaneously arranged and affixed therein (e.g., the previously depicted embodiment where the double-sided PCB 250 is arranged and affixed in one half of opening 230, and a suitable component is arranged in the other half of opening 230). However, it is of note that in any suitable embodiment, no components protruding into any opening may extend beyond the second surface 524 of second side 520.

Figure 6:
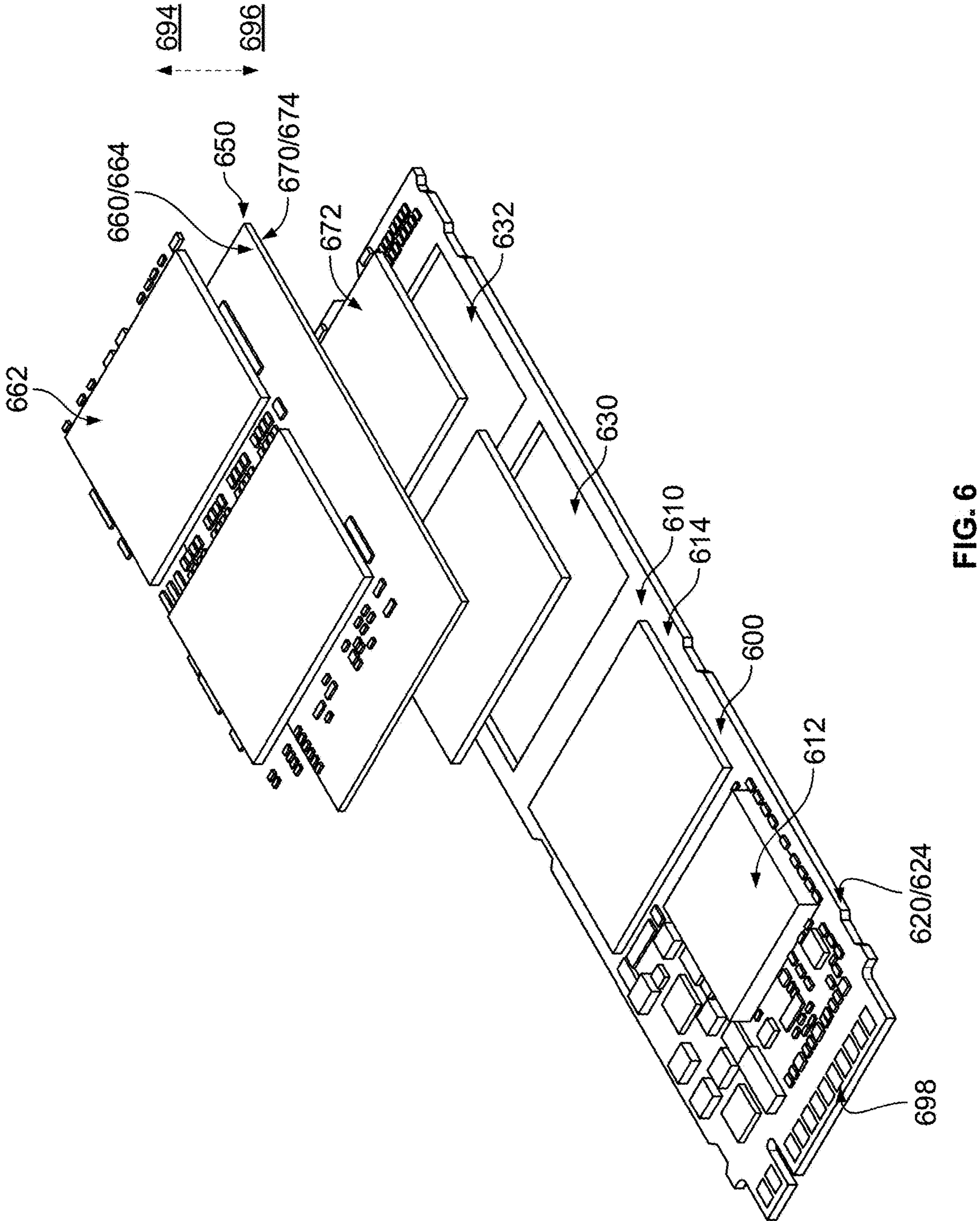
FIG. 6 shows an illustrative device incorporating a single-sided PCB with components arranged thereon and with two openings, and a double-sided PCB, in accordance with some embodiments of the present disclosure.

FIG. 6 shows a device incorporating a single-sided PCB 600 with components (i.e., first components 612) arranged thereon and with two openings (i.e., a first opening 630 and a second opening 632), and a double-sided PCB 650, in accordance with some embodiments of the present disclosure. The exemplary single-sided PCB 600 includes a first side 610 with a first surface 614 on which first components 612 are arrangeable, a second side 620 with a second surface 624, a first opening 630, a second opening 632, a double-sided PCB 650 that has a third side 660 with a third surface 664 on which second components 662 are arrangeable and that has a fourth side 670 with a fourth surface 674 on which third components 672 are arrangeable, and a connector 698 (e.g., having similar designs and functions to that of the previously described connector 298), although other visual and/or physical components may be included or substituted in other embodiments.

The single-sided PCB 600 includes a first side 610 with a first surface 614 on which first components 612 are arrangeable, and it will be understood that these elements have similar functions and design to that of the previously described first side 210 that has the first surface 214 in FIG. 2. For example, first side 610 with first surface 614 faces a first direction 692, and may (or may not) have first components 612 arranged thereon, where the first components 612 may include a NAND flash memory, an application-specific integrated circuit, a power management integrated circuit, a temperature sensitive component, a SIP, any suitable similar components, or a combination thereof.

The single-sided PCB 600 includes a second side 620 with a second surface 624 that faces a second direction 694, and it will be understood that these elements have similar functions and designs to that of the previously described second side 220 that has the second surface 224 in FIG. 2.

The single-sided PCB 600 includes a first opening 630 and a second opening 632, where both openings are rectangular in shape and extend from the first side 610 through the second side 620. However, it will be understood that the first opening 630 has similar functions and designs to that of the previously described first opening 530 in FIG. 5 and that the second opening 632 has similar functions and designs to that of the previously described second opening 532 in FIG. 5, and that the sizes, shapes, locations, any suitable similar dimensions, or a combination thereof may be utilized for the first opening 630 and/or the second opening 632.

The single-sided PCB 600 includes a double-sided PCB 650 arranged and affixed on the first surface 614 of the first side 610. For example, the double-sided PCB 650 may be soldered onto the first surface 614 of first side 610. In another suitable approach, double-sided PCB 650 may be installed directly and/or partially into the first opening 630 and/or the second opening 632 (e.g., attached directly to the single-sided PCB 600). It will be understood that different shapes, sizes, dimensions (e.g., width, length, thickness), other suitable similar dimensions, or a combination thereof may be utilized for double-sided PCB 650, as long as the device adheres to the requirements of the specified form factor. It will be further understood that while double-sided PCB 650 is shown as being arranged and affixed in first opening 630 and second opening 632, any other suitable device may be arranged either in addition to or in place of double-sided PCB 650, such as, for instance, an integrated circuit, a package such as a field-programmable gate array (FPGA), system in a package (SIP), suitable similar components, or a combination thereof, as long as the substituted element protrudes into openings 630 and 632 without protruding beyond the second surface 624 (or the fifth surface, if applicable). For example, double-sided PCB 650 may have one or more SIPs arranged on one or both sides. In another suitable approach, double-sided PCB 650 may be arranged on only first opening 630, and a suitable component such as a SIP or an integrated circuit may be arranged separately on the second opening 632. In another suitable approach, double-sided PCB 650 may be a first double-sided PCB, and double-sided PCB 650 may have no components arranged on one side (i.e., double-sided PCB 650 is instead a single-sided PCB) and may further include a third opening thereon, and a suitable component, such as a SIP, an integrated circuit, or a second double-sided PCB may be arranged and affixed in the third opening.

The double-sided PCB 650 includes a third side 660 with a third surface 664 on which second components 662 are arrangeable. The third surface 664 faces the first direction 692, and the second components 662 may include a NAND flash memory, an application-specific integrated circuit, a power management integrated circuit, a temperature sensitive component, a SIP, any suitable similar components, or combinations thereof.

The double-sided PCB 650 includes a fourth side 670 that has a fourth surface 674 on which third components 672 are arrangeable and that faces the second direction 694. It will be understood that fourth side 670, fourth surface 674, and third components 672 have similar designs and functions to that of fourth side 270, fourth surface 274, and third components 272 from FIG. 2, respectively. It will be further understood that the double-sided PCB 650 may be arranged and affixed onto the single-sided PCB 600 such that some of the third components 672 are protruding into first opening 630, and some of the third components 672 are protruding into second opening 632. In another suitable embodiment, the double-sided PCB 650 may be a first double-sided PCB 650, such that first double-sided PCB 650 is arranged and affixed such that third components 672 extend only into the first opening 630. In such a configuration, a second double-sided PCB may be simultaneously arranged and affixed onto single-sided PCB 600 such that components arranged on a side of the second double-sided PCB protrude into the second opening 632. However, it is of note that in any suitable embodiment, no components protruding into any opening may extend beyond the second side 624 of second surface 620.

Figure 7:
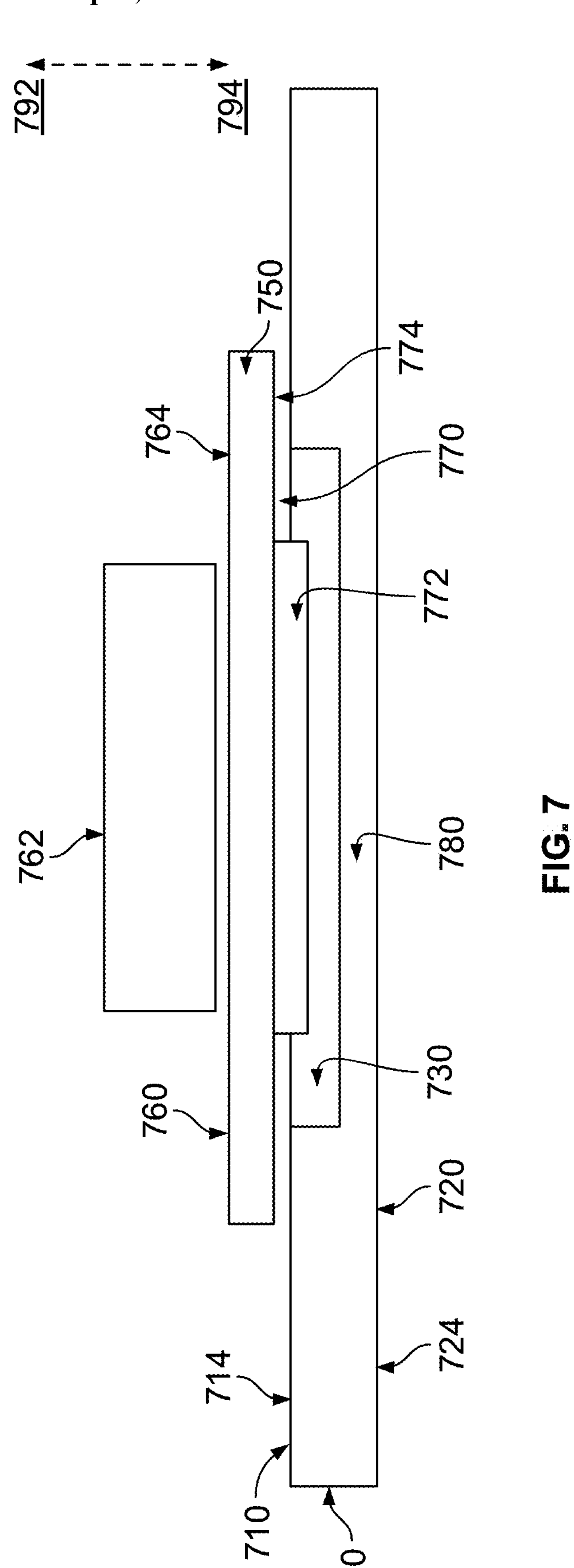
FIG. 7 shows a side view of an illustrative device incorporating a single-sided PCB with a depression and a double-sided PCB, in accordance with some embodiments of the present disclosure.

FIG. 7 shows a side view of a device incorporating a single-sided PCB 700 with a depression 730 and a double-sided PCB 750, in accordance with some embodiments of the present disclosure. The exemplary single-sided PCB 700 includes a first side 710 with a first surface 714, a second side 720 with a second surface 724, a depression 730, a double-sided PCB 750 that includes a third side 760 with a third surface 764 on which second components 762 are arranged and that includes a fourth side 770 with a fourth surface 774 on which third components 772 are arranged, and a fifth surface 780, although other visual and/or physical components may be included or substituted in other embodiments (e.g., the connector 298, previously described in FIG. 2).

The single-sided PCB 700 includes a first side 710 that has a first surface 714 and that faces a first direction 792, and a second side 720 with a second surface 724 that faces a second direction 794. It will be understood that these elements have similar functions and designs to that of the previously described first side 210 that has first surface 214 and second side 220 that has the second surface 224 in FIG. 2, respectively.

The single-sided PCB 700 includes a depression 730 that extends partially from the first side 710, although other shapes, sizes, locations, similar suitable dimensions, or a combination thereof may be utilized. It will be understood that depression 730 has similar functions and designs to that of the previously described opening 230 in FIG. 2. For example, in the present embodiment where the depression 730 extends partially from first side 710, the first side 710 further includes a fifth surface 780, and the third components 772 protruding into the depression 730 do not protrude beyond fifth surface 780. In another suitable approach, depression 730 may extend from first side 710 through second side 720, and it will be understood that the third components 772 protruding into the depression 730 may not extend beyond the second surface 724 of second side 720.

The single-sided PCB 700 includes a double-sided PCB 750 arranged and affixed thereon, where the double-sided PCB 750 includes a third side 760 that has a third surface 764 on which second components 762 are arranged and a fourth side 770 that has a fourth surface 774 on which third components 772 are arranged. It will be understood that the double-sided PCB 750 has similar functions and designs to that of double-sided PCB 250 in FIG. 2. For example, similar to a previously described approach, single-sided PCB 700 may be a double-sided substrate with a first depression extending at least partially from first side 710 to first side 720 and a second opening extending at least partially from second side 720 to first side 710, and double-sided PCB 750 may be a first double-sided PCB and may be arranged and affixed in the first opening, and a second double-sided PCB that shares similar designs and functions to that of the first double-sided PCB may be arranged and affixed in the second opening. It will be further understood that the third side 760 that has the third surface 764 on which second components 762 are arranged has similar functions and designs to that of third side 260, third surface 264, and second components 262 from FIG. 2, respectively, and that the fourth side 770 that has the fourth surface 774 on which third components 772 are arranged has similar functions and designs to that of fourth side 270, fourth surface 274, and third components 272, respectively.

The single-sided PCB 700 includes a fifth surface 780 that is located in the partial depression 730 and faces first direction 792. No components may extend from the fifth surface 780, and none of the third components arranged on the fourth surface 774 protrude beyond fifth surface 780.

Figure 8:
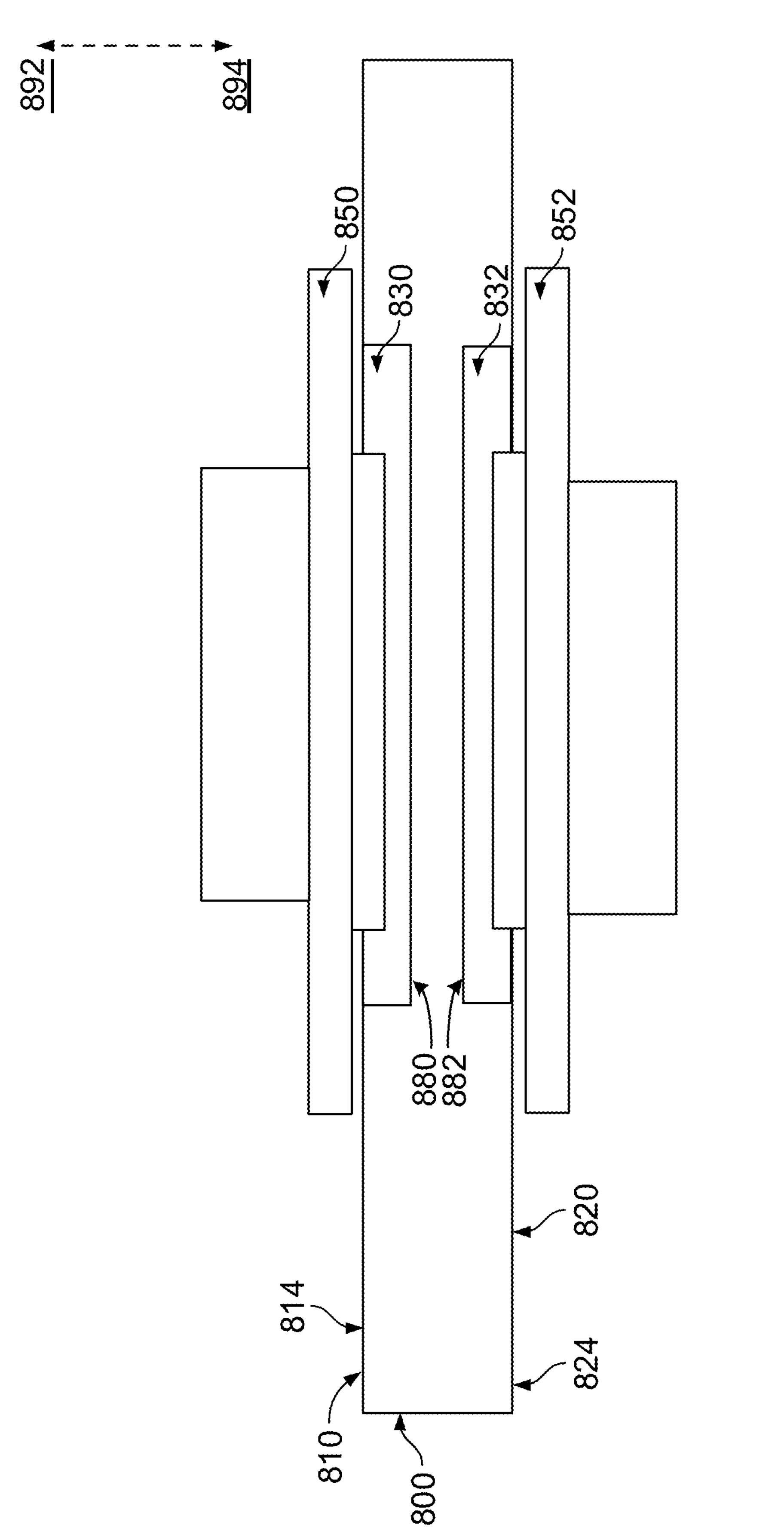
FIG. 8 shows an illustrative example of a device incorporating a double-sided substrate with openings on both sides and two double-sided PCBs, in accordance with some embodiments of the present disclosure.

FIG. 8 shows an illustrative example of a device incorporating a double-sided substrate 800 with openings on both sides and two double-sided PCBs, in accordance with some embodiments of the present disclosure. The exemplary double-sided substrate 800 includes a first side 810 with a first surface 814, a second side 820 with a second surface 824, a first depression 830, a second depression 832, a first double-sided PCB 850, a second double-sided PCB 852, a fifth surface 880, and a sixth surface 882, although other visual and/or physical components may be included or substituted in other embodiments (e.g., the connector 298, the third side 260 with third surface 264 on double-sided PCB 250, and/or the fourth side 270 with fourth surface 274 on double-sided PCB 250, as previously described in FIG. 2).

The double-sided substrate 800 includes a first side 810 that has a first surface 814 and that faces a first direction 892, and it will be understood that these elements have similar functions and designs to that of the previously described first side 210 that has first surface 214 in FIG. 2, respectively.

The double-sided substrate 800 includes a second side 820 that has a second surface 824 and that faces a second direction 894. Second surface 824 may have components arranged thereon, where the components may include a NAND flash memory, an application-specific integrated circuit, a power management integrated circuit, a temperature sensitive component, a system in a package (SIP), any suitable similar components, or a combination thereof.

The double-sided substrate 800 includes a first depression 830 that extends partially from the first side 810 and a second depression 832 that extends partially from the second side 820, although other shapes, sizes, locations, similar suitable dimensions, or a combination thereof may be utilized. It will be understood that first depression 830 and second depression 832 have similar functions and designs to that of the previously described depression 730 in FIG. 7. For example, in the present embodiment where first depression 830 extends partially from first side 810 and second depression 832 extends partially from second side 820, the first side 810 further includes a fifth surface 880, and the second side 820 further includes a sixth surface 882, where components protruding into first depression 830 do not protrude beyond fifth surface 880, and components protruding into second depression 832 do not protrude beyond sixth surface 882. The fifth surface 880 faces the first direction 892, and the sixth surface 882 faces the second direction 894.

The double-sided substrate 800 includes a first double-sided PCB 850 arranged and affixed in first opening 830, and a second double-sided PCB 852 arranged and affixed in second opening 832, although other shapes, sizes, and locations of first double-sided PCB 850 and second double-sided PCB 852 may be utilized as well. It will be understood that the first double-sided PCB 850 has similar designs and functions to that of the double-sided PCB 250 in FIG. 2 (e.g., first double-sided PCB 850 may include, for instance, a third side that faces first direction 892 and that has a third surface on which components may be arranged and a fourth side that faces second direction 894 and that has a fourth surface on which components may be arranged). It will be further understood that the second double-sided PCB 852 also includes similar designs to that of the double-sided PCB 250 but is arranged and affixed in the second opening 832 that extends from the second side 820 (e.g., the double-sided PCB 852 includes a third side and a fourth side, but the third side faces the second direction 894 and the fourth side faces the first direction 892).

The double-sided substrate 800 includes a fifth surface 880 that is located in the partial first depression 830 and faces first direction 892. No components may extend from the fifth surface 880, and no components protruding into first opening 830 protrude beyond the fifth surface 880.

The double-sided substrate 800 includes a sixth surface 882 that is located in the partial second depression 832 and faces second direction 894. No components may extend from the sixth surface 882, and no components protruding into second opening 832 may protrude beyond the sixth surface 880.

Figure 9:
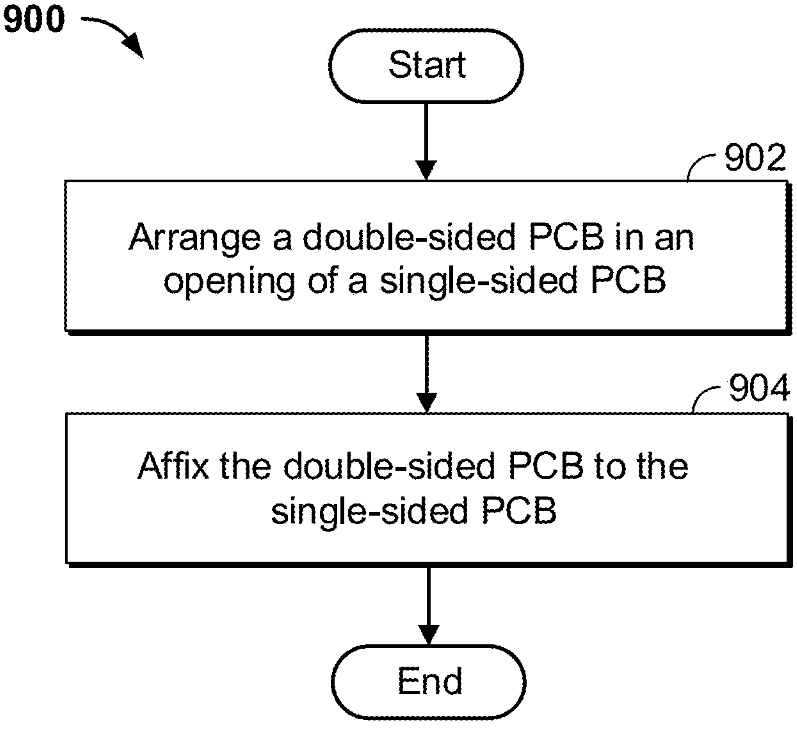
FIG. 9 shows a flowchart of illustrative steps for arranging and affixing a double-sided printed circuit board to a single-sided printed circuit board with an opening, in accordance with some embodiments of the present disclosure.

FIG. 9 shows a flowchart 900 of illustrative steps for arranging and affixing a double-sided printed circuit board to a single-sided printed circuit board with an opening, in accordance with some embodiments of the present disclosure. Although FIG. 9 is described in the context of the particular structures, components, and processing of the present disclosure, and although a particular order and flow of steps are depicted in FIG. 9, it will be understood that in some embodiments, one or more of the steps may be modified, moved, removed, or added, and that the order of steps depicted in FIG. 9 may be modified.

Exemplary steps for arranging and affixing a double-sided printed circuit board to a single-sided printed circuit board begins at step 902, where the double-sided printed circuit board is arranged in an opening of a single-sided PCB. The single-sided PCB further includes a first side with a first surface, and a second side with a second surface, and the double-sided PCB includes a third side with a third surface, and a fourth side with a fourth surface. The double-sided PCB may have components extending from both the third and fourth surfaces, and the arrangement of the double-sided PCB on the single-sided PCB may incorporate necessary or specified requirements. For example, the double-sided PCB may be arranged on the single-sided PCB such that required form factor conditions, if specified, are still met. For example, the double-sided PCB may be arranged in the opening of the single-sided PCB such that components extending from the fourth surface of the double-sided PCB protrude into the opening but do not protrude beyond the second side of the single-sided PCB. For example, components may include a NAND flash memory, an application-specific integrated circuit, a power management integrated circuit, a temperature sensitive component, a SIP, any suitable similar components, or a combination thereof. In another suitable approach, where the opening is a partial depression that extends from the first side, then the first side further includes a fifth surface, and it will be understood that the components protruding from the fourth surface protrude into the opening but do not extend beyond the fifth surface. Processing may then continue to step 904.

At step 904, the arranged double-sided PCB is then affixed to the single-sided PCB. For example, the double-sided PCB may be soldered onto the first side of the single-sided PCB. In another suitable approach, the double-sided PCB may be installed directly and/or partially into the opening of the single-sided PCB (e.g., attached directly to the single-sided PCB). It will be understood that in any of the suitable approaches, the double-sided PCB is affixed such that the necessary requirements specified in step 902 continue to be met (e.g., a specified form factor, components protruding into the opening but not beyond the second surface, similar suitable requirements, or a combination thereof).

Figure 10:
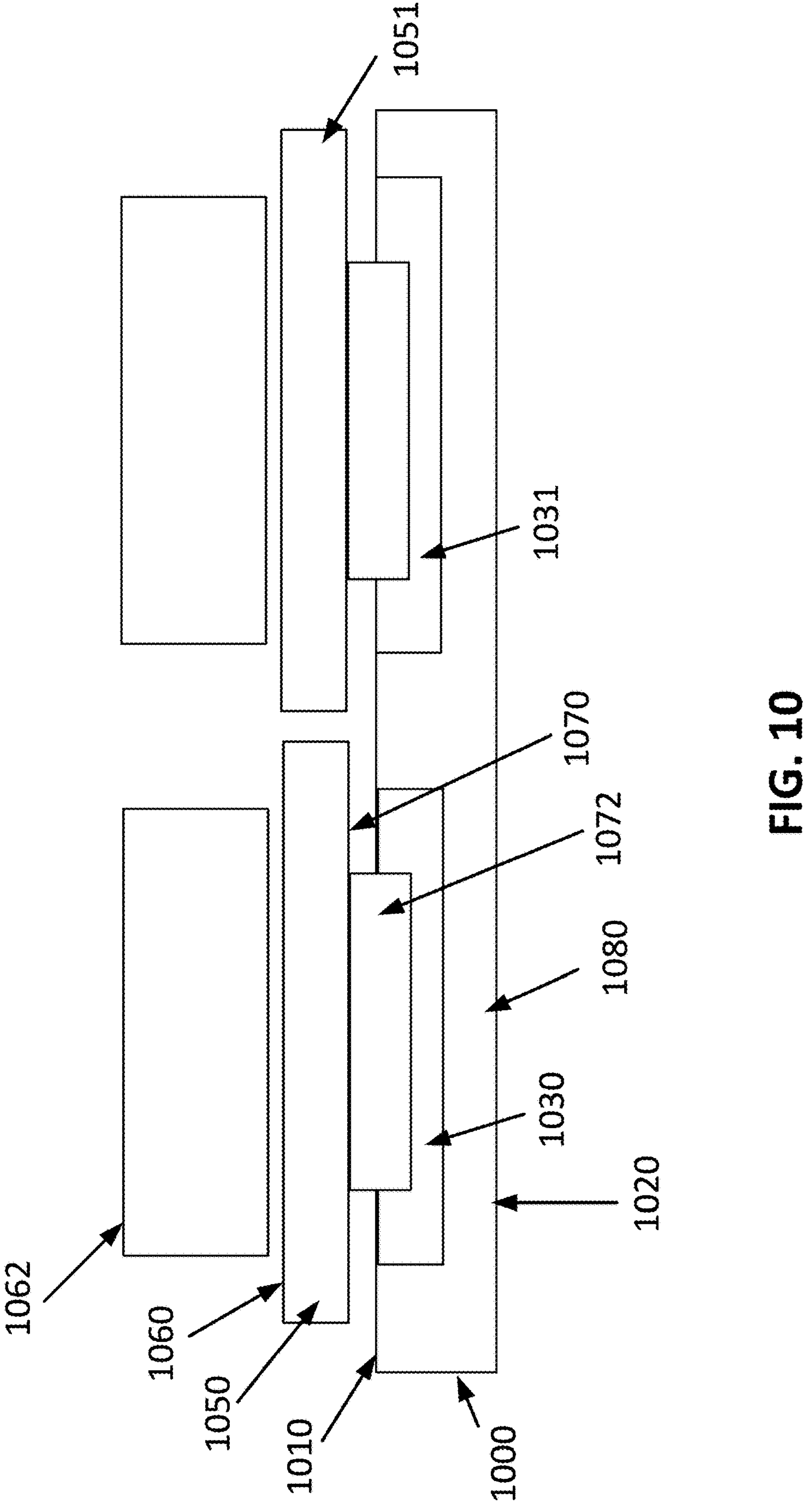
FIG. 10 shows a side view of an illustrative device incorporating a single-sided PCB with two openings on the same side and two double-sided PCBs, in accordance with some embodiments of the present disclosure.

FIG. 10 shows an illustrative example of a device incorporating a single-sided PCB 1000 with first and second openings on a side of the PCB 1000 and first and second double-sided PCBs 1050, 1051 arranged and affixed in respective ones of the first and second openings, in accordance with some embodiments of the present disclosure. One or more features of the single-sided PCB 1000 may correspond with one or more features of any of the single-sided PCBs (e.g., any of PCBs 200, 300, 500, 600, 700, etc.) as described with respect to FIGS. 1-8 and may be omitted for clarity and brevity. One or more features of any of the double-sided PCBs 1050, 1051 may correspond with one or more features of any of the double-sided PCBs (e.g., any of PCBs 250, 350, 450, 550, 650, 750, etc.) as described with respect to FIGS. 1-8 and may be omitted for clarity and brevity.

The single-sided PCB 1000 includes a first side 1010, a second side 1020 with a surface 1080, depressions 1030, 1031, and first and second double-sided PCBs 1050, 1051. Each of the first and second double-sided PCBs 1050, 1051 may respectively include a third side (e.g., third side 1060) on which second components (e.g., second components 1062) are arranged and that includes a fourth side-1070 on which third components 1072 are arranged. Each of the depressions 1030, 1031 may respectively extend partially from the first side 1010, although other shapes, sizes, locations, similar suitable dimensions, or a combination thereof may be utilized. It will be understood that each of the depressions 1030, 1031 has similar functions and designs to that of the previously described opening 230 in FIG. 2. For example, in the present embodiment where the depression 1030 extends partially from first side 1010, third components 1072 protrudes into the depression 1030 and does not protrude beyond the surface 1080. In some embodiments, any of depressions 1030, 1031 may extend from first side

1010 through second side 1020, and it will be understood that respective third components (e.g., third components 1072) protruding into the corresponding depression (e.g., depression 1030) may not extend beyond the surface 1080 of second side 1020.

As described in preceding paragraphs, in some embodiments, the single-sided PCB 1000 may include at least one additional opening extending at least partially through from the first side 1010 to the second side 1020, wherein a respective double-sided PCB is arranged and affixed in a respective one of the at least one additional openings. The first double-sided PCB 1050 may be arranged and affixed such that third components 1072 extend into the first depression 1030, and the second double-sided PCB 1051 may be arranged and affixed such that corresponding components extend into the second depression 1031. The first double-sided PCB 1050 may be positioned adjacent to the second double-sided PCB 1051. The double-sided PCBs 1050, 1051 may share similar designs and functions to that of any of the double-sided PCBs described in the present disclosure (e.g., any of PCBs 250, 350, 450, 550, 650, 750, etc.).

The foregoing is merely illustrative of the principles of this disclosure, and various modifications may be made by those skilled in the art without departing from the scope of this disclosure. The above-described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following paragraphs.

While some portions of this disclosure may refer to examples, any such reference is merely to provide context to the instant disclosure and does not form any admission as to what constitutes the state of the art.

What is claimed is:

1. A single-sided printed circuit board, comprising:
- a first side comprising a first surface on which first components are arranged;
- a second side comprising a second surface;
- a first opening extending at least partially through from the first side to the second side, wherein a first double-sided printed circuit board is capable of being arranged and affixed in the first opening, wherein:
  - the first double-sided printed circuit board comprises a third side comprising a third surface on which second components are arranged, and a fourth side comprising a fourth surface on which third components are arranged,
  - the third surface and the first surface face a first direction, and the fourth surface and the second surface face a second direction, and
  - none of the third components protrude beyond the second surface;
- a connector;
- a heat spreader that covers the third components arranged on the fourth surface, wherein the heat spreader does not protrude beyond the second surface; and
- at least one additional opening extending at least partially through from the first side to the second side, wherein a respective additional double-sided printed circuit board is arranged and affixed in a respective one of the at least one additional opening.

2. The single-sided printed circuit board of claim 1, wherein the first side comprises a fifth surface in the opening, the fifth surface facing the first direction, and wherein none of the third components protrude beyond the fifth surface.

3. The single-sided printed circuit board of claim 1, wherein the first opening extends from the first side through the second side.

4. The single-sided printed circuit board of claim 1, wherein the first double-sided printed circuit board is soldered to the single-sided printed circuit board.

5. The single-sided printed circuit board of claim 1, wherein the first double-sided printed circuit board is arranged and affixed within the first opening and within at least one of the at least one additional opening.

6. The single-sided printed circuit board of claim 1, wherein the third components arranged on the fourth surface of the double-sided printed circuit board are arranged in the opening and wherein at least the third surface is arranged above the first surface.

7. The single-sided printed circuit board of claim 1, wherein the third components arranged on the fourth surface comprise at least one of a NAND flash memory, an application-specific integrated circuit, a power management integrated circuit, or a temperature sensitive component.

8. The single-sided printed circuit board of claim 1, wherein the connector is on an edge of the single-sided printed circuit board.

9. The single-sided printed circuit board of claim 7, wherein the second components arranged on the third surface comprise at least one of a NAND flash memory, an application-specific integrated circuit, a power management integrated circuit, or a temperature sensitive component.

10. A device, comprising:
- a single-sided printed circuit board, comprising:
  - a first side comprising:
    - a first surface on which first components are arrangeable;
  - a second side comprising a second surface;
  - a first opening extending at least partially through from the first side to the second side;
  - a connector; and
  - at least one additional opening extending at least partially through from the first side to the second side;
- a first double-sided printed circuit board arranged and affixed in the first opening, wherein:
  - the first double-sided printed circuit board comprises a third side comprising a third surface on which second components are arranged, and a fourth side comprising a fourth surface on which third components are arranged,
  - the third surface and the first surface face a first direction, and the fourth surface and the second surface face a second direction, and
  - none of the third components protrude beyond the second surface;
- a heat spreader that covers the third components arranged on the fourth surface, wherein the heat spreader does not protrude beyond the second surface; and
- at least one additional double-sided printed circuit board arranged and affixed in a respective one of the at least one additional opening.

11. The device of claim 10, wherein the first side comprises a fifth surface in the opening, the fifth surface facing the first direction, and wherein none of the third components protrude beyond the fifth surface.

12. The device of claim 10, wherein the first opening extends from the first side through the second side.

13. The device of claim 10, wherein the device comprises an M.2 form factor, 2.5 " form factor, mSATA form factor, U.2 form factor, 2230 form factor, 2242 form factor, 2280 form factor, or 22110 form factor.

14. The device of claim 10, wherein the first double-sided printed circuit board is soldered to the single-sided printed circuit board.

15. The device of claim 10, wherein the first double-sided printed circuit board is arranged and affixed in the first opening and in at least one of the at least one additional opening.

16. The device of claim 10, wherein the third components arranged on the fourth surface are arranged in the opening and wherein at least the third surface is arranged above the first surface.

17. The device of claim 10, wherein the third components arranged on the fourth surface comprise at least one of a NAND flash memory, an application-specific integrated circuit, a power management integrated circuit, or a temperature sensitive component.

18. The device of claim 10, wherein the connector is on an edge of the single-sided printed circuit board.

19. The device of claim 17, wherein the second components arranged on the third surface comprise at least one of a NAND flash memory, an application-specific integrated circuit, a power management integrated circuit, or a temperature sensitive component.

20. A double-sided printed circuit board, comprising:

a first side comprising a first surface on which first components are arranged;

a second side comprising a second surface on which second components are arranged;

wherein the double-sided printed circuit board is configured to be arranged and affixed in a first opening of a single-sided printed circuit board that extends at least partially through from a third side of the single-sided printed circuit board to a fourth side of the single-sided printed circuit board, wherein third components extend from a third surface of the third side of the single-sided printed circuit board, wherein the second components protrude into the opening but none of the second components protrude beyond a fourth surface of the fourth side, and wherein at least one additional double-sided printed circuit board is arranged and affixed in a respective one of at least one additional opening of the single-sided printed circuit board that extend at least partially through from the third side of the single-sided printed circuit board to the fourth side of the single-sided printed circuit board; and a heat spreader that covers the second components arranged on the second surface, wherein the heat spreader does not protrude beyond the fourth surface.

21. The double-sided printed circuit board of claim 20, wherein the third side of the single-sided printed circuit board comprises a fifth surface in the opening, the fifth surface and the third surface facing a first direction, and wherein none of the third components protrude beyond the fifth surface.

22. The double-sided printed circuit board of claim 20, wherein the opening extends from the third side of the single-sided printed circuit board through the fourth side.

23. The double-sided printed circuit board of claim 20, wherein the double-sided printed circuit board is soldered to the single-sided printed circuit board.

24. The double-sided printed circuit board of claim 20, wherein the double-sided printed circuit board is arranged and affixed within the first opening and within at least one of the at least one additional opening.

25. The double-sided printed circuit board of claim 20, wherein the components extending from the second surface of the double-sided printed circuit board are arranged in the opening of the single-sided printed circuit board and wherein at least the first surface is arranged above the third surface.

26. The double-sided printed circuit board of claim 20, wherein the second components arranged on the second surface comprise at least one of a NAND flash memory, an application-specific integrated circuit, a power management integrated circuit, or a temperature sensitive component.

27. The double-sided printed circuit board of claim 20, wherein a connector is on an edge of the single-sided printed circuit board.

28. The double-sided printed circuit board of claim 26, wherein the first components arranged on the first surface comprise at least one of a NAND flash memory, an application-specific integrated circuit, a power management integrated circuit, or a temperature sensitive component.

* * * * *